United States Patent
Pain

(10) Patent No.: US 6,933,488 B2
(45) Date of Patent: Aug. 23, 2005

(54) VARIABLE ELECTRONIC SHUTTER IN CMOS IMAGER WITH IMPROVED ANTI SMEARING TECHNIQUES

(75) Inventor: Bedabrata Pain, Los Angeles, CA (US)

(73) Assignee: California Institute of Technology, Pasadena, CA (US)

(*) Notice: Subject to any disclaimer, the term of this patent is extended or adjusted under 35 U.S.C. 154(b) by 773 days.

(21) Appl. No.: 09/681,797

(22) Filed: Jun. 6, 2001

(65) Prior Publication Data

US 2002/0047086 A1 Apr. 25, 2002

Related U.S. Application Data

(60) Provisional application No. 60/210,295, filed on Jun. 8, 2000.

(51) Int. Cl.$^7$ ............................................. H01L 31/00
(52) U.S. Cl. ............................ 250/214.1; 250/208.1; 348/308; 257/463
(58) Field of Search ..................... 250/208.1, 214.1; 348/294, 308, 300–302; 257/222, 225, 233, 288, 257–258, 290–291

(56) References Cited

U.S. PATENT DOCUMENTS 4,631,400 A * 12/1986 Tanner et al. ............... 250/221
6,532,040 B1 * 3/2003 Kozlowski et al. .......... 348/241
6,801,258 B1 * 10/2004 Pain et al. ................... 348/302

* cited by examiner

Primary Examiner—Stephone B. Allen
Assistant Examiner—Patrick J. Lee
(74) Attorney, Agent, or Firm—Fish & Richardson P.C.

(57) ABSTRACT

A leakage compensated snapshot imager provides a number of different aspects to prevent smear and other problems in a snapshot imager. The area where the imager is formed may be biased in a way that prevents photo carriers including electrons and holes from reaching a storage area. In addition, a number of different aspects may improve the efficiency. The capacitance per unit area of the storage area may be one, two or more orders of magnitude greater than the capacitance per-unit area of the photodiode. In addition, a ratio between photodiode capacitance and storage area capacitance is maintained larger than 0.7.

15 Claims, 2 Drawing Sheets

VARIABLE ELECTRONIC SHUTTER IN CMOS IMAGER WITH IMPROVED ANTI SMEARING TECHNIQUES

CROSS REFERENCE TO RELATED APPLICATIONS

This application claims priority from application Ser. No. 60/210,295, filed Jun. 8, 2000.

U.S. Government may have certain rights in this invention pursuant to Nasa contract number NAS7-1407.

BACKGROUND OF INVENTION

Electronically shuttered imagers have been implemented using various image sensor technologies. For example, interline transfer charge coupled devices, CMOS active pixels, and pinned photodiode active pixels have been used for forming electronically shuttered imagers.

Many of these imagers may suffer from interframe smear and motion artifacts.

In addition, it may be desirable to provide the ability to program exposure time of such a device. The programmability may be programmable down to a level of a fraction of the frame readout time. This may operate to faithfully reproduce fast motion such as in sports photography.

SUMMARY OF INVENTION

The present application teaches a CMOS photodiode imager that provides snapshot imaging with electronic shutting and that may avoid smearing.

In an embodiment, all pixel values may be stored simultaneously, and the image is obtained by reading these out row by row. A special pixel cell redesign may take into account the causes of previous interframe smearing and motion artifacts.

In an embodiment, optical and diffusion shields for the in pixel storage part are provided. These shields may prevent leakage of charge from other areas into the in pixel storage part.

In addition, the effective photodiode and storage capacitance may be optimized in order to improve signal swing and lower the noise. The optimization may be carried out according to a ratio of optimum relationships between device capacitances. The disclosed pixel architecture may allow the in pixel capacitor to be implemented with a minimal impact on the fill factor.

Advantages may include high fidelity and reduction of motion-related artifact, reduced leakage into the in pixel memory, thus minimizing the smearing effect during imaging, programmable exposure time independent of frame readout time, and high quantum efficiency imaging. In addition, this system may produce a low noise output.

An aspect defines smear-free snapshot imaging is obtained while maintaining high quantum efficiency and low noise. This may be due to the use of a storage capacitor with much higher per-unit capacitance.

BRIEF DESCRIPTION OF DRAWINGS

These and other aspects will now be described in detail with reference to the accompanying drawings, wherein.

DETAILED DESCRIPTION

Imaging sensors with in pixel memories are known. However, the present inventors realize that the interframe smear and motion artifact may be due, at least partly, to seepage of charge from other areas, into the in-pixel memory. The charge may include charge that is left over from other exposure times, for example.

For example, if there is a 5 percent leakage into the memory part of the chip, there is a 20:1 ratio between frame readout time and exposure time. This may result in a 50 percent unwanted signal. This can correspondingly cause image smear. To the extent that the unwanted signal is representative of other exposure times, it may also introduce motion artifact.

Figure 1:
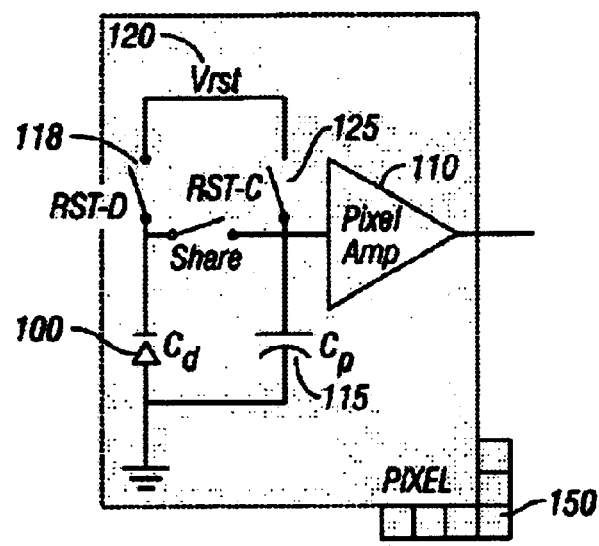
FIG. 1 shows a pixel array including a detailed diagram of a single pixel.

A snapshot imager is shown in FIG. 1. The basic embodiment includes an array of photoreceptors. A single photoreceptor 100 is shown, with the rest of the array being shown generically as 150.

Photoreceptor 100 is shown in a circuit with a pixel amplifier 110. In the embodiment, the photoreceptor 100 may be a photodiode. A storage capacitance 115 is placed in parallel with the photoreceptor 100. The storage capacitance 115 may act as both a frame buffer memory, and as the sensing node.

The photodiode 100 is held in reset by closing the reset switch 118, to connect the photodiode to the reset voltage 120. The photodiode 100 operates to convert incoming photons to electrons (photoelectrons) for a specified amount of exposure time. The exposure time is defined by the length of the interval during which the reset signal is held in reset.

The storage capacitance is analogously reset by closing the reset switch 125. In an embodiment, the storage capacitance 115 may be reset after the exposure, by pulsing the switch 125 into its closed position. After that, charge from the photodiode 100 may be simultaneously transferred into the storage capacitance by pulsing the "share" switch 130.

The charge may be simultaneously transferred from all the different photoreceptors of the array, into all of the different storage capacitances 115 in all of the pixels 150 in the array. Since all of the photoreceptors are sampled at the same time, a snapshot of the entire array is taken at this one time. The charge may be read out row by row, but the charge that is read out is all representative of a single-time snapshot image.

The exposure time may be varied independently by choosing the duration during which the reset level 118 is held low.

Once the charge from the photodiode has been transferred into the capacitance 115 is complete, the photodiode may be reset and then begin a new frame exposure. Values stored on the in pixel frame memory are again scanned and out row at a time just as would occur in a conventional CMOS image sensor.

A number of issues are considered in a snapshot imager of this type. It is desirable to vary the exposure time which, as described above, is possible in the FIG. 1 circuit. In addition, smear has occurred in such circuits, which the present inventors believes is due to charge leakage into the capacitor 115. At least part of this leakage is from image acquisitions from previous integration times. The leakage may result from an unwanted collection of photoelectrons via lateral diffusion from the photodiode 100. The duration of the unwanted collection may vary depending on the row readout time. The maximum time may be one frame readout duration. However, a 5 percent leakage may lead to an intolerable 50 percent smear. In addition, extra pixel circuit elements and the in pixel storage, may take up real estate on the chip, and hence reduce the quantum efficiency of the system. Read noise may also be a problem.

A special pixel architecture is described herein that addresses these issues and may improve the pixel efficiency. The pixel architecture as described herein may produce a barrier field, e.g., based on electrical potentials, around the pixel storage area. The barrier field may prevent or discourage photoelectrons from the adjoining areas, e.g., the substrate and photodiode, from entering the pixel storage area.

In an embodiment, capacitor 115 may be implemented with a per-unit-area-capacitance that may be many orders of magnitude higher the capacitance per unit area for the photodiode 100, e.g., it may be 2 orders of magnitude higher. This may enable reduction of the storage capacitance size, and reduce noise. In addition, there may be minimal if any effect on the fill factor. For similar reasons, the quantum efficiency may be improved. This pixel architecture may also allow photodiode implementation with a high collection efficiency in order to improve quantum efficiency.

Figure 2:
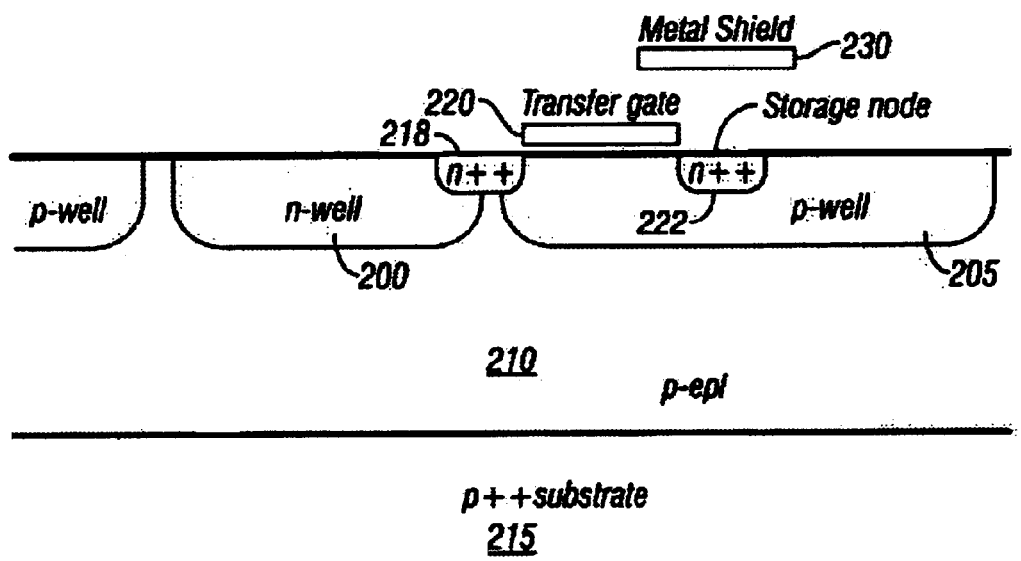
FIG. 2 shows a cross section of layers forming a photodiode.

The pixel architecture is represented by the cross-section shown in FIG. 2. A twin well process with a lightly doped epitaxial layer is used. The twin well process includes an n well 200 and a P well 205. Both the N well 200 and the P well 205 are formed in a P type epitaxial substrate 210 formed on the P++ substrate 215. The P well 200 acts as a photodiode. A storage capacitance 222 may be implemented in the P well 205. The storage capacitance may be implemented as a diffusion capacitance or as a gate capacitance. A transfer gate 200 is provided between the photodiode 218 and the storage capacitance 222. The transfer gate 220 may be driven by the share switch 130 in FIG. 1. Both the photodiode 218 and the storage capacitance to hundred 222 may be implemented as n++ regions within the wells.

A metal shield 230 may be located over the storage node 222, and may operate to maintain the integrity of stored photocharge in the storage node 222. In addition, a potential well may be introduced around the storage node 222. The storage node is located in the P. well 205, and this P. well may be held at ground potential. The other wells around the P. well, including the P. type epitaxial well 210, and the N well 200, may be biased above ground. Therefore, electrons generated in either of these wells may be prevented from reaching the storage node 222 by the potential barrier that is directed around the storage node. Moreover, the N++ area forming the storage node 222 within the P. well is effectively reverse biased. Because of this reverse bias, no holes will reach the storage node 222. The holes will rather be drained out through a P++ contact layer that is within the P. type well 200. This effectively protects the storage node against coupling from the photodiode, and thus allows smearless imaging.

The total capacitance of the photo site $C_d$ is defined by the sum of the capacitance of the photodiode, and the capacitance of the n++ region within the well. The doping of the epitaxial layer 210 may be very small. This may cause the diode capacitance $C_p$ to be very small also, e.g. <1 fF. Therefore, the per-unit area capacitance for the capacitor 115 may be much larger than the per-unit area capacitance for the photodiode, e.g., an order of magnitude larger, or two orders of magnitude larger. As such, the capacitor 115 may take up only a very small fraction of the area of the cell, and as such may have minimal effect on the fill factor of the device.

The value of the photodiode capacitance is determined primarily by the capacitance of the n++ implant in the n well 200 and the P well (to the left of the transfer gate). This allows the capacitance of the photodiode and the capacitance of the capacitor to be changed over a relatively large range in order to optimize the noise without extensively affecting the imager's quantum efficiency.

There may be an optimum value for the value $C_P$, the capacitance of the capacitor 115. This optimum value may be governed by read noise considerations. Read noise in a photodiode based snapshot type active pixel sensor is substantially primarily governed by the noise at the pixel. This noise at the pixel may include both photodiode and storage capacitance reset noise as well as charge sharing noise cause during transfer of charge from the photodiode to the storage capacitance.

If the charge of $\Delta q_D$ is accumulated on $C_D$ during one frame, and only a fraction of that charge is transferred to the in pixel frame storage capacitor $C_P$ after charge sharing, the amount of charge added to $C_P$ is given by:

$$\Delta q_p = \frac{C_p}{C_d + C_p} \cdot \Delta q_d \tag{1}$$

The conversion gain is defined as the potential change on the sensing or storage node due to the photocharges:

$$\frac{\Delta V_{sense}}{\Delta q_d} = \frac{1}{C_d + C_p} \tag{2}$$

The sharing of signal between $C_P$ and $C_D$ may cause an attenuation in the desired signal. The charge handling capacity may be governed by the amount by which the photodiode can actually swing. If the total swing on the photodiode is defined by the value $V_{diode, Max}$, then the charge handling capacity may be given by $$q_{d,max} = C_d \cdot V_{diode,max} \tag{3}$$

Another issue is raised by read noise. If the noise added in the pixel source follower or in the other electronics of the image sensor is excluded, then read noise is basically from three sources. First, read noise may be caused from the reset noise at $C_P$ that is associated with resetting $C_P$. Read noise is also caused from $C_D$, again with noise associated with resetting $C_D$. The noise may also be caused by uncertainties created by charge sharing between $C_P$ and $C_D$. This uncertainty may be considered as:

$$\langle \Delta q_m^2 \rangle = kT \cdot \left(\frac{C_d + C_p}{C_p}\right)^2 \cdot \left[C_p + \frac{C_p \cdot C_d}{C_d + C_p}\right] + kT \cdot C_d \tag{4}$$

$$\Rightarrow \ldots = kT \cdot \left[C_d + \frac{(C_d + C_p)^2}{C_p} + \frac{C_d}{C_p} \cdot (C_d + C_p)\right] \quad \text{where } \alpha = \frac{C_p}{C_d}$$

$$\Rightarrow \ldots = kTC_d \cdot \left[1 + \left(\frac{1+\alpha}{\alpha}\right) \cdot (2+\alpha)\right]$$

Figure 3:
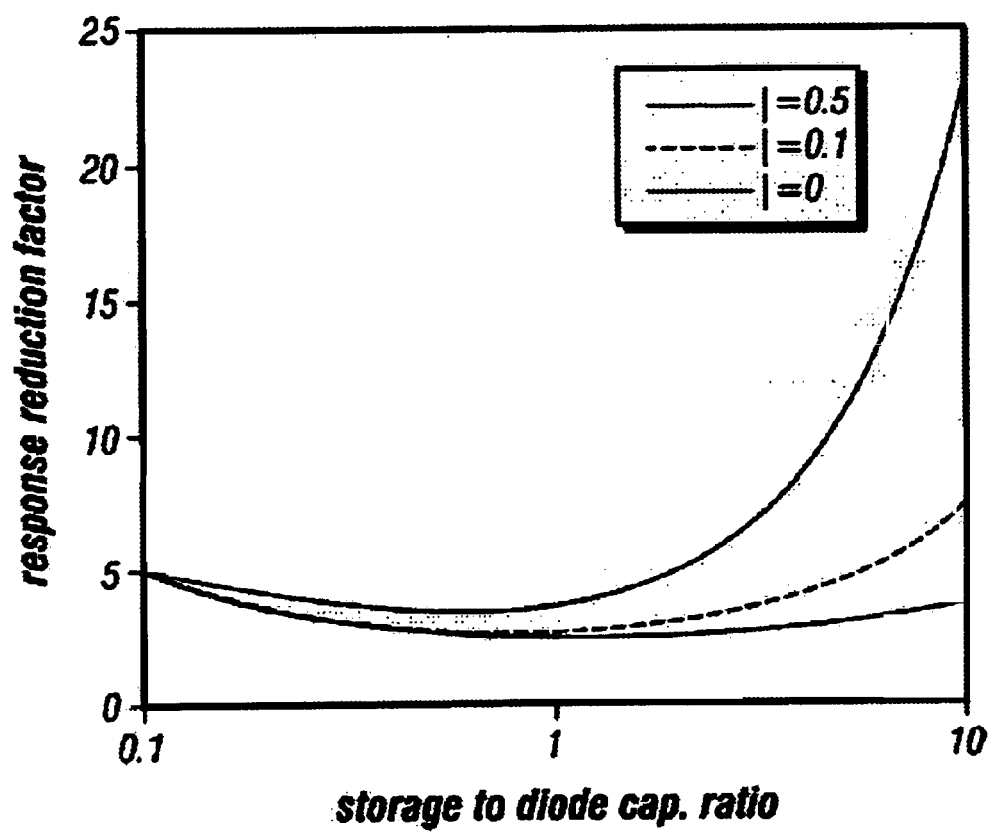
FIG. 3 shows a ratio graph for the values of α.

The inventors have plotted this function, which is shown as FIG. 3. It is observed that the noise increase over a conventional photodiode implementation may reach a minimum of around 3 at a value $\alpha=0.9$. Furthermore, by incorporating transistors, and the capacitance CP in the pixel, the fill factor may be reduced, thus lowering the responsivity of the pixel. When this is compared with an active pixel sensor with the same photodiode capacitance, the effective responsivity reduction is therefore:

$$\left[1 + \left(\frac{1+\alpha}{\alpha}\right) \cdot (2+\alpha)\right] \cdot (1 + \lambda \cdot \alpha) \qquad (5)$$

where $\lambda$ is a factor expressing the effect of fill factor loss. If $\lambda$ is zero, then there is no impact on the fill factor. If $\lambda$ is 1, then the effective frame storage capacitance or $C_P$ per-unit area is the same as that for the photodiode. FIG. 3 shows the different values, and shows how the effective response reduction factor may be optimum when $\alpha$ is between 0.7 and 1. For small values of $\alpha$, the gain loss due to charge sharing at the pixel may be significant and may lead to loss of responsivity. For values of $\alpha$ that are too large, the reset noise at $C_P$ becomes larger then the reset noise at CP during the non snapshot mode of operation. The fill factor loss may also cause an additional response loss. Hence, or larger $\alpha$, response reduction may increase.

Another advantage is that, in spite of charge sharing, smear-free snapshot imaging is obtained without sacrificing full-well. This is the case since full-well is determined not by the diode voltage swing, but by the swing of the pixel source follower. Since optimally the capacitance ratios are nearly equal, and since source-follower signal swing is half the voltage swing of the diode, no loss of full-well is encountered.

Another aspect obtains smear free snapshot imaging is obtained while eliminating spurious noise and image lag using a dummy pixel row. In addition to read noise minimization, an issue may be raised by image lag and signal dependent noise (spurious noise). Image lag and signal dependent noise arises due to variations in the reset levels on the diode ($C_D$) and the storage capacitance ($C_P$). In general, when RST-C and RST-D are pulsed, capacitors $C_D$ and $C_P$ are charged to different values based on their initial conditions (e.g. the signal in the previous frame). In order to eliminate image lag and spurious noise, the pixel can be preset before reset. Presetting forces the initial conditions of all the pixels to be substantially identical, irrespective of signal strengths in the previous frame, and hence eliminates both spurious noise and image lag.

The preset level is determined by the current flow in the column bus (through the pixel source-follower). For snapshot imaging, the diode and storage capacitance is reset at different times. In fact, most often the diode capacitance is reset without disturbing the storage capacitance. However, only the storage capacitance, and not the diode capacitance is not directly connected to the pixel source follower. Hence, this architecture poses problems for presetting the diode, since presetting requires current flow in the source follower. In our approach, this is circumvented by adding an additional dummy row of pixels which is activated every time a pixel diode (or all pixel diodes) are preset and reset. This ensures that every diode and storage capacitance is always reset to the same potential, eliminating spurious noise and image lag. In this scheme, elimination of these two effects is accomplished without adding any hardware inside the pixel itself, thereby preserving high quantum efficiency. Hence, the pixel architecture is compatible with high quantum efficiency, minimum read noise, high linearity, and no or minimal image lag or spurious noise.

Although only a few embodiments have been described in detail above, other modifications are possible. All such modifications are intended to be encompassed within the following claims, in which:

What is claimed is:

1. A photosensor element, comprising:

a photosensor, located to receive incoming light, and to create photo carriers based on said incoming light, said photosensor having a first capacitance per-unit area; and a storage capacitance, selectively coupled to said photosensor, and having a second capacitance per-unit area which is at least two orders of magnitude larger than the first capacitance per unit area of the photodiode.

2. An element as in claim 1, further comprising a controllable gate, coupled between said photosensor and said storage capacitance, which is selectively actuated to transfer a signal from said photosensor to said storage capacitance.

3. An element as in claim 1, further comprising a light shield element, located to shield said storage capacitance against incoming light.

4. An element as in claim 1, further comprising a reset structure, which operates to reset values in said photosensor and said storage capacitance, based on applied control signals.

5. An element as in claim one, wherein said photosensor has a capacitance $C_P$, said storage capacitance has a capacitance $C_D$, and a value $\alpha$ is defined as $C_P/C_D$, and wherein said value $\alpha$ is >0.7.

6. An element as in claim 5, wherein said value $\alpha$ is >0.9.

7. An element as in claim 1, wherein said second capacitance per-unit area is at least ten times greater than said first capacitance per-unit area.

8. An element as in claim 1, wherein said photosensor includes a photodiode.

9. An element as in claim 8, further comprising a semiconductor region forming an n well, holding said photodiode, and a second semiconductor region forming a P well, holding said storage capacitance.

10. An element as in claim 9, further comprising a P type lightly doped epitaxial layer, underlying both said first semiconductor region and said second semiconductor region.

11. An element as in claim 9, wherein said photodiode is formed as an N++region within said n well, and said storage capacitance is formed as an N++region within said P well.

12. An element as in claim 11, further comprising a transfer gate, formed on the semiconductor substrate, and extending between the first N++region and the second N++region.

13. An element as in claim 9, further comprising a metal shield, formed over at least a portion of said P well and shielding said storage node against incoming light.

14. An element as in claim 9, further comprising a bias applied to said P well that prevents photo carriers from reaching said storage node.

15. An element as in claim 14, wherein said bias includes grounding said P well, and holding said N well at a bias above ground.

* * * * *